(12) United States Patent
Nomaru

(10) Patent No.: US 11,839,931 B2
(45) Date of Patent: Dec. 12, 2023

(54) LASER PROCESSING APPARATUS

(71) Applicant: DISCO CORPORATION, Tokyo (JP)

(72) Inventor: Keiji Nomaru, Tokyo (JP)

(73) Assignee: DISCO CORPORATION, Tokyo (JP)

(*) Notice: Subject to any disclaimer, the term of this patent is extended or adjusted under 35 U.S.C. 154(b) by 54 days.

(21) Appl. No.: 17/450,894

(22) Filed: Oct. 14, 2021

(65) Prior Publication Data

US 2022/0143747 A1 May 12, 2022

(30) Foreign Application Priority Data

Nov. 11, 2020 (JP) ................. 2020-187975

(51) Int. Cl.
*B23K 26/0622* (2014.01)
*B23K 26/70* (2014.01)
*H01S 5/34* (2006.01)

(52) U.S. Cl.
CPC ........ *B23K 26/0622* (2015.10); *B23K 26/702* (2015.10); *H01S 5/3401* (2013.01)

(58) Field of Classification Search
CPC .. H01S 5/3401; B23K 26/702; B23K 26/0622
USPC ...................................................... 219/121.6
See application file for complete search history.

(56) References Cited

U.S. PATENT DOCUMENTS

| | | | | |
|---|---|---|---|---|
| 3,860,784 A * | 1/1975 | Brown | ............... | B23K 26/0643 219/121.84 |
| 4,566,765 A * | 1/1986 | Miyauchi | ........... | B23K 26/0604 219/121.6 |
| 4,698,692 A * | 10/1987 | Fry | ......................... | G02F 1/113 347/246 |
| 6,649,861 B2 * | 11/2003 | Duignan | ............ | B23K 15/0006 219/121.68 |
| 6,862,490 B1 * | 3/2005 | Duignan | ........... | H01L 21/67028 700/121 |
| 7,569,840 B2 * | 8/2009 | Morikazu | .............. | B23K 26/04 219/121.75 |
| 7,826,509 B2 * | 11/2010 | Belkin | .................. | H01S 5/4031 372/50.122 |
| 8,258,428 B2 * | 9/2012 | Morikazu | ............ | B23K 26/067 219/121.77 |
| 8,309,885 B2 * | 11/2012 | Peng | ........................ | H01S 5/12 219/121.76 |
| 8,487,208 B2 * | 7/2013 | Kobayashi | ............. | G02F 1/113 359/305 |
| 9,724,783 B2 * | 8/2017 | Odagiri | ................. | B23K 26/04 |
| 2005/0236381 A1 * | 10/2005 | Nomaru | .............. | B23K 26/042 219/121.75 |

(Continued)

FOREIGN PATENT DOCUMENTS

JP 10305420 A 11/1998
WO WO-2012143702 A1 * 10/2012 ......... G02B 21/0024

*Primary Examiner* — Jimmy Chou
(74) *Attorney, Agent, or Firm* — GREER BURNS & CRAIN, LTD.

(57) ABSTRACT

A laser beam irradiation unit of a laser processing apparatus includes a first pulsed laser oscillator that oscillates a pulsed laser having a wavelength of 9 to 11 μm and a pulse width of 5 ns or less, a $CO_2$ amplifier that amplifies a pulsed laser beam emitted from the first pulsed laser oscillator, and a condenser that focuses the pulsed laser beam amplified by the $CO_2$ amplifier on a workpiece held on the chuck table.

19 Claims, 3 Drawing Sheets

(56) References Cited

U.S. PATENT DOCUMENTS

| | | | |
|---|---|---|---|
| 2006/0076326 A1* | 4/2006 | Kobayashi | B23K 26/0613 219/121.73 |
| 2006/0076327 A1* | 4/2006 | Kobayashi | B23K 26/40 219/121.73 |
| 2006/0201920 A1* | 9/2006 | Morikazu | B23K 37/0435 219/121.81 |
| 2007/0119835 A1* | 5/2007 | Nomaru | B23K 26/53 219/121.73 |
| 2007/0138156 A1* | 6/2007 | Nomaru | B23K 26/0853 219/121.73 |
| 2008/0031291 A1* | 2/2008 | Kobayashi | B23K 26/0884 250/205 |
| 2008/0037596 A1* | 2/2008 | Kobayashi | B23K 26/40 250/492.1 |
| 2008/0061042 A1* | 3/2008 | Nomaru | B23K 26/066 219/121.67 |
| 2008/0110868 A1* | 5/2008 | Morikazu | B23K 26/0853 219/121.67 |
| 2008/0169274 A1* | 7/2008 | Sawabe | B23K 26/40 219/121.67 |
| 2008/0180697 A1* | 7/2008 | Sawabe | B23K 26/0861 356/630 |
| 2008/0204748 A1* | 8/2008 | Nomaru | B23K 26/0853 356/332 |
| 2008/0205458 A1* | 8/2008 | Kobayashi | H01L 21/67092 372/25 |
| 2008/0217301 A1* | 9/2008 | Nomaru | B23K 26/40 219/121.8 |
| 2008/0245779 A1* | 10/2008 | Nomaru | B23K 26/082 219/121.75 |
| 2009/0064521 A1* | 3/2009 | Sawabe | B23K 26/53 33/645 |
| 2009/0066969 A1* | 3/2009 | Sawabe | G01B 11/0608 356/614 |
| 2009/0153868 A1* | 6/2009 | Sawabe | B23K 26/0665 356/445 |
| 2009/0266802 A1* | 10/2009 | Sawabe | B23K 26/0853 219/121.78 |
| 2009/0277889 A1* | 11/2009 | Kobayashi | B23K 26/53 219/121.78 |
| 2012/0103952 A1* | 5/2012 | Nomaru | B23K 26/40 219/121.67 |
| 2012/0111840 A1* | 5/2012 | Nomaru | B23K 26/53 219/121.67 |
| 2012/0199565 A1* | 8/2012 | Nomaru | B23K 26/064 219/121.67 |
| 2012/0292297 A1* | 11/2012 | Morikazu | B23K 26/40 219/121.72 |
| 2012/0298636 A1* | 11/2012 | Nomaru | B23K 26/0861 219/121.61 |
| 2013/0068740 A1* | 3/2013 | Nomaru | B23K 26/0853 219/121.78 |
| 2013/0193122 A1* | 8/2013 | Nomaru | B23K 26/0622 219/121.62 |
| 2013/0240494 A1* | 9/2013 | Nomaru | B23K 26/0652 219/121.75 |
| 2013/0334185 A1* | 12/2013 | Nomaru | B23K 26/042 219/121.82 |
| 2013/0334186 A1* | 12/2013 | Nomaru | B23K 26/02 219/121.82 |
| 2014/0034624 A1* | 2/2014 | Nomaru | B23K 26/0648 219/121.75 |
| 2014/0259659 A1* | 9/2014 | Kleinert | B23K 26/0676 219/121.81 |
| 2015/0246848 A1* | 9/2015 | Ikenoue | C03C 23/0025 219/121.61 |
| 2015/0292865 A1* | 10/2015 | Nomaru | G01B 11/0608 356/630 |
| 2016/0045980 A1* | 2/2016 | Asano | B23K 26/705 219/121.74 |
| 2016/0183990 A1* | 6/2016 | Koizumi | C12M 25/02 606/285 |
| 2017/0064801 A1* | 3/2017 | Lambert | B23K 26/702 |
| 2018/0257171 A1* | 9/2018 | Morikazu | H01L 21/681 |
| 2019/0074221 A1* | 3/2019 | Nomaru | B23K 26/53 |
| 2019/0126397 A1* | 5/2019 | Nomaru | H01L 21/68764 |

* cited by examiner

LASER PROCESSING APPARATUS

BACKGROUND OF THE INVENTION

Field of the Invention

The present invention relates to a laser processing apparatus that carries out processing by irradiating a workpiece with a laser beam.

Description of the Related Art

A wafer has a front surface partitioned by a plurality of crossing planned division lines into a plurality of regions, and a plurality of devices such as integrated circuits (ICs) or large scale integration (LSI) circuits are formed in the respective regions. The wafer is divided by a laser beam into individual device chips, and the divided device chips are used for electric appliances such as mobile phones and personal computers.

As the laser beam used in dividing the wafer, a pulsed laser beam of ultraviolet light of a wavelength having absorptivity with respect to a substrate (silicon, for example) forming the wafer, for example, a wavelength of 266 nm or 355 nm, is commonly used (see Japanese Patent Laid-open No. Hei 10-305420, for example).

SUMMARY OF THE INVENTION

Some wafers to be divided by a laser beam into individual device chips have a front surface coated with a passivation film (an $SiO_2$ film, for example) for protecting devices. In such a case, if a pulsed laser beam of ultraviolet light having absorptivity with respect to a material of the substrate forming the wafer is applied along the planned division lines coated with the passivation film, laser processed grooves are not favorably formed, and the passivation film is peeled off from the wafer. This leads to deterioration in quality of device chips.

Meanwhile, since a laser beam of a wavelength of a mid-infrared region has absorptivity with respect to $SiO_2$ forming the passivation film and, particularly, the absorptivity is high in a wavelength of 9.1 to 9.3 µm, it is preferable to irradiate the wafer with a $CO_2$ laser beam. However, in the case of irradiating the wafer with a $CO_2$ laser beam of a wavelength of a mid-infrared region, distortion by heat remains in the device chips due to thermal absorption, and this lowers die strength of the device chips.

Accordingly, it is an object of the present invention to provide a laser processing apparatus that can suppress thermal absorption to reduce distortion by heat remaining in device chips.

In accordance with an aspect of the present invention, there is provided a laser processing apparatus including a chuck table for holding a workpiece, a laser beam irradiation unit that irradiates the workpiece held on the chuck table with a pulsed laser beam to carry out processing, and a processing-feed mechanism that processing-feeds the chuck table and the laser beam irradiation unit relative to each other. The laser beam irradiation unit includes a first pulsed laser oscillator that oscillates a first pulsed laser having a wavelength of 9 to 11 µm and a pulse width of 5 ns or less, a $CO_2$ amplifier that amplifies a first pulsed laser beam emitted from the first pulsed laser oscillator, and a condenser that focuses the first pulsed laser beam amplified by the $CO_2$ amplifier on the workpiece held on the chuck table.

Preferably, the first pulsed laser oscillator can use a quantum cascade semiconductor laser or a distributed feedback semiconductor laser, and the first pulsed laser oscillator uses gain-switching to adjust the pulse width.

Preferably, the laser beam irradiation unit further includes thinning-out means that is disposed between the first pulsed laser oscillator and the $CO_2$ amplifier and thins out the first pulsed laser beam emitted from the first pulsed laser oscillator. Preferably, the thinning-out means includes an acousto-optic element for thinning out the first pulsed laser beam by diffraction or an electro-optic element for causing a polarization plane of the first pulsed laser beam to rotate and thinning out the first pulsed laser beam by using a polarization plate.

Preferably, the laser beam irradiation unit further includes a dichroic mirror disposed between the $CO_2$ amplifier and the condenser and a second pulsed laser oscillator that oscillates a second pulsed laser in a range of green to ultraviolet light and emits a second pulsed laser beam, and the second pulsed laser beam in the range of green to ultraviolet light is reflected by the dichroic mirror, led to the condenser, and focused on the workpiece.

With the laser processing apparatus according to the present invention, distortion by heat due to thermal absorption does not remain in individual device chips obtained by dividing a wafer, and it is possible to solve the problem that the die strength of the divided device chips is lowered.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A laser processing apparatus according to an embodiment of the present invention is hereinafter described in detail with reference to the attached drawings.

Figure 1:
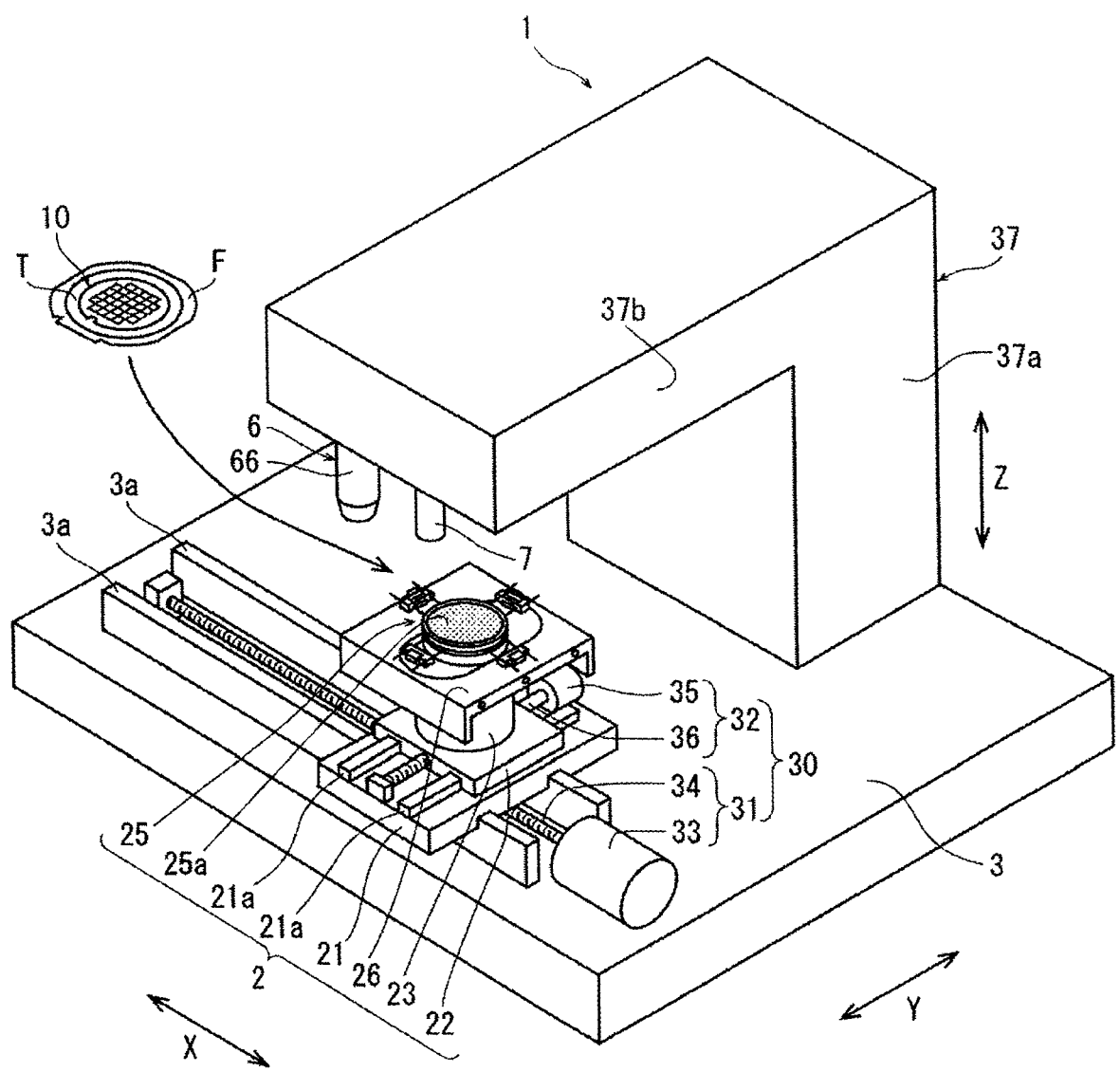
FIG. 1 is a perspective view illustrating the whole of a laser processing apparatus.

FIG. 1 illustrates a laser processing apparatus 1 according to the present embodiment. The laser processing apparatus 1 at least includes a holding unit 2 that holds a workpiece, a laser beam irradiation unit 6, and a movement mechanism 30 disposed as processing-feed means for processing-feeding the holding unit 2 and the laser beam irradiation unit 6 relative to each other in an X-axis direction and a Y-axis direction. The X-axis direction is indicated by an arrow X in FIG. 1, and the Y-axis direction is perpendicular to the X-axis direction and indicated by an arrow Y in FIG. 1.

The holding unit 2 is disposed on a base 3 and includes a rectangular X-axis direction moving plate 21 placed on the base 3 movably in the X-axis direction, a rectangular Y-axis direction moving plate 22 placed on the X-axis direction moving plate 21 movably in the Y-axis direction, a column 23 of a cylindrical shape fixed to an upper surface of the Y-axis direction moving plate 22, and a rectangular cover plate 26 fixed to an upper end of the column 23. The cover plate 26 has a slot, and a chuck table 25 having a holding surface 25a defined by the X axis and the Y axis is disposed so as to extend upward through the slot. The chuck table 25 is rotatable by a rotational drive mechanism not illustrated. The holding surface 25a is formed of a porous material having air permeability and is connected to a suction source, not illustrated, via a channel extending inside the column 23. In the left upper part of FIG. 1, a wafer 10 to be laser-processed by the laser processing apparatus 1 of the present embodiment is illustrated.

Figure 2:
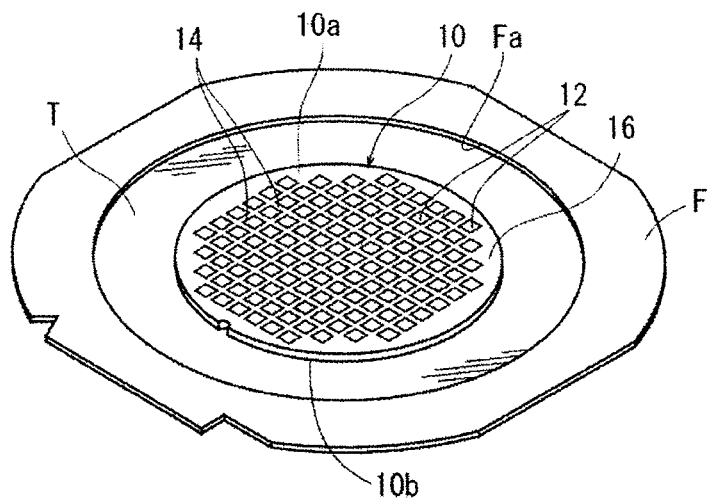
FIG. 2 is a perspective view illustrating a wafer to be processed by the laser processing apparatus of FIG. 1.

The wafer 10 as a workpiece in the present embodiment is now described with reference to FIG. 2. The wafer 10 has a front surface 10a partitioned by a plurality of crossing planned division lines 14 into a plurality of regions, and a plurality of devices 12 are formed in the respective regions. The wafer 10 is positioned at a center of an opening Fa formed in an annular frame F, and a back surface 10b of the wafer 10 is attached to a protective tape T that is attached at an outer periphery thereof to the frame F, so that the wafer 10 is supported by the frame F. On the front surface 10a of the wafer 10, a passivation film 16 for protecting the devices 12 is formed. The passivation film 16 is, for example, an $SiO_2$ film forming an insulating film having a low dielectric constant, that is, what is generally called a Low-k film.

Referring back to FIG. 1, the movement mechanism 30 is disposed on the base 3 and includes an X-axis direction feeding mechanism 31 for processing-feeding the holding unit 2 in the X-axis direction, a Y-axis direction feeding mechanism 32 for index-feeding the Y-axis direction moving plate 22 in the Y-axis direction, and the rotational drive mechanism, not illustrated, for rotating the chuck table 25. The X-axis direction feeding mechanism 31 converts rotational motion of a pulse motor 33 into linear motion through a ball screw 34 and transmits the linear motion to the X-axis direction moving plate 21, to thereby move the X-axis direction moving plate 21 back and forth in the X-axis direction along guide rails 3a on the base 3. The Y-axis direction feeding mechanism 32 converts rotational motion of a pulse motor 35 into linear motion through a ball screw 36 and transmits the linear motion to the Y-axis direction moving plate 22, to thereby move the Y-axis direction moving plate 22 back and forth in the Y-axis direction along guide rails 21a on the X-axis direction moving plate 21.

It is to be noted that, though not illustrated, the X-axis direction feeding mechanism 31, the Y-axis direction feeding mechanism 32, and the chuck table 25 are provided with position detecting means, and the position detecting means accurately detects an X-axis coordinate, a Y-axis coordinate, and a rotational position in a circumferential direction of the chuck table 25. The positional information thus detected is transmitted to a control unit (denoted by 100 in FIG. 3) of the laser processing apparatus 1. The X-axis direction feeding mechanism 31, the Y-axis direction feeding mechanism 32, and the rotational drive mechanism, not illustrated, of the chuck table 25 are driven in response to an instruction signal that is transmitted from the control unit 100 on the basis of the positional information, so that the chuck table 25 can be located at a desired position on the base 3.

As illustrated in FIG. 1, a frame body 37 stands upright on a lateral side of the holding unit 2. The frame body 37 includes a vertical wall portion 37a disposed on the base 3 along a Z-axis direction (upward-downward direction) perpendicular to the X-axis direction and the Y-axis direction, and a horizontal wall portion 37b extending horizontally from an upper end portion of the vertical wall portion 37a. An optical system of the laser beam irradiation unit 6 is housed inside the horizontal wall portion 37b of the frame body 37, and a condenser 66 configuring part of the optical system is disposed on a lower surface of a tip end portion of the horizontal wall portion 37b.

On the lower surface of the tip end portion of the horizontal wall portion 37b, an imaging unit 7 is disposed at a position adjacent, in the X-axis direction, the condenser 66 of the laser beam irradiation unit 6. The imaging unit 7 is used in alignment for imaging the wafer 10 held on the chuck table 25 to detect a processing position and the like. The imaging unit 7 includes a normal imaging device (charge coupled device or CCD) for imaging with visible light, illumination means for applying visible light, infrared irradiation means for applying infrared light, an infrared CCD capable of capturing an image with the infrared light applied, and the like. An image captured by the imaging unit 7 is transmitted to the control unit 100 described above.

Figure 3:
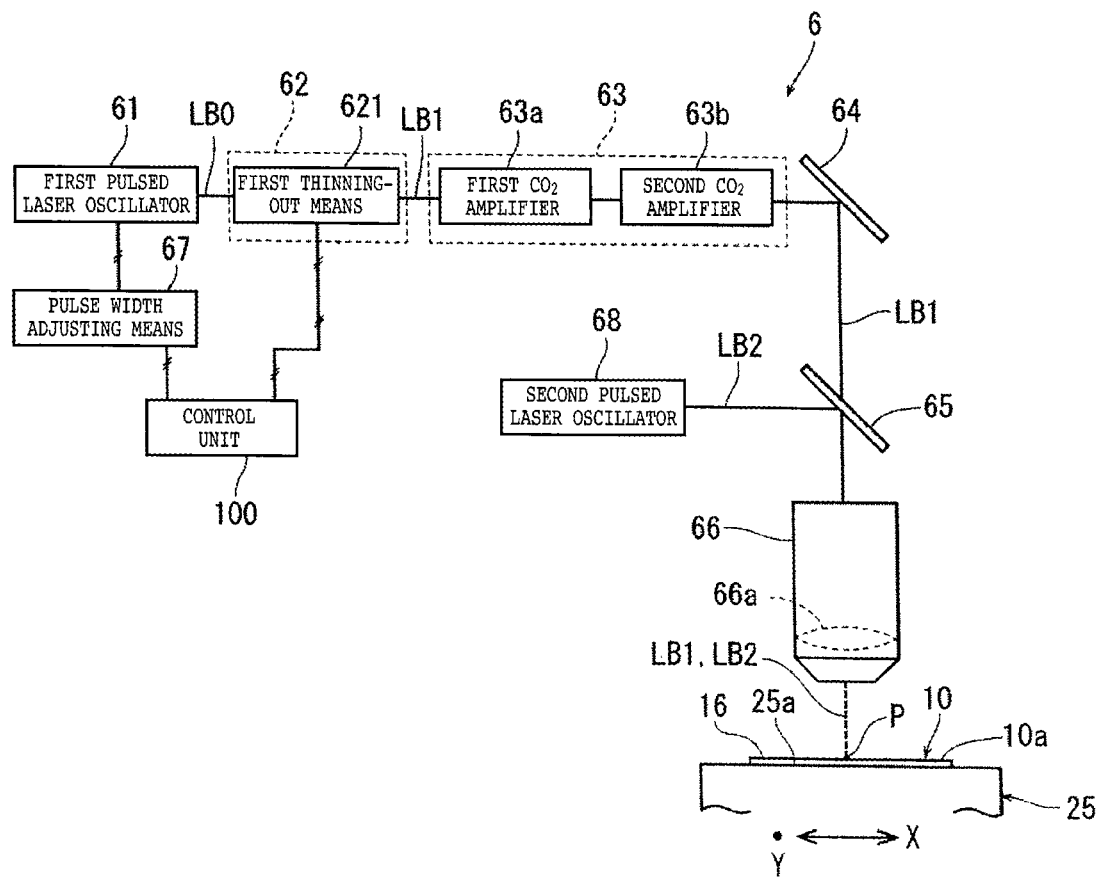
FIG. 3 is a block diagram illustrating a laser beam irradiation unit disposed in the laser processing apparatus of FIG. 1.

The optical system of the laser beam irradiation unit 6 housed in the horizontal wall portion 37b of the laser processing apparatus 1 according to the present embodiment is now described with reference to FIG. 3. As illustrated in FIG. 3, the laser beam irradiation unit 6 includes a first pulsed laser oscillator 61, thinning-out means 62, a $CO_2$ amplifier 63, and a condenser 66. The first pulsed laser oscillator 61 emits a pulsed laser beam LB0. The thinning-out means 62 thins out pulses at a predetermined rate as necessary from the pulsed laser beam LB0 emitted from the first pulsed laser oscillator 61. The $CO_2$ amplifier 63 amplifies a pulsed laser beam LB1 outputted from the thinning-out means 62. The condenser 66 focuses the pulsed laser beam LB1 amplified by the $CO_2$ amplifier 63 to thereby position its focused spot P on the front surface 10a of the wafer 10 held on the holding surface 25a of the chuck table 25. The wavelength of the pulsed laser beam LB0 emitted from the first pulsed laser oscillator 61 is set to 9 to 11 μm. It is to be noted that the first pulsed laser oscillator 61 can use a quantum cascade semiconductor laser or a distributed feedback semiconductor laser.

The pulse width of the pulsed laser beam LB0 emitted from the first pulsed laser oscillator 61 in the present embodiment is set to 5 ns or less, and more preferably, set to 100 to 200 ps. The first pulsed laser oscillator 61 is provided with a pulse width adjusting means 67 for adjusting the pulse width as necessary such that the pulsed laser beam LB0 emitted from the first pulsed laser oscillator 61 has a desired pulse width. Gain-switching, for example, can be used in the pulse width adjusting means 67. The pulse width adjusting means 67 is connected to the control unit 100 and adjusts the pulse width to have a desired value on the basis of an instruction signal transmitted from the control unit 100.

Figure 4:
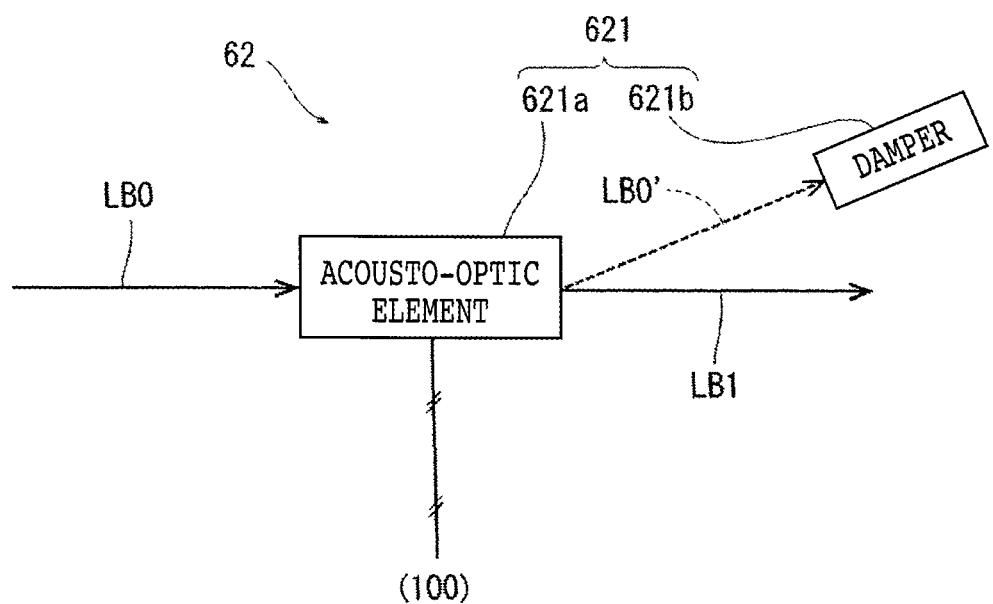
FIG. 4 is a block diagram outlining an example of thinning-out means of FIG. 3.

Between the first pulsed laser oscillator 61 and the $CO_2$ amplifier 63, the thinning-out means 62 for thinning out, at suitable intervals, the pulsed laser beam LB0 emitted from the first pulsed laser oscillator 61 as necessary is disposed. The thinning-out means 62 can adopt, for example, first thinning-out means 621 using an acousto-optic element 621a that diffracts the pulsed laser beam LB0 to thin out the pulsed laser beam at a predetermined rate. FIG. 4 outlines a configuration of the first thinning-out means 621. The first thinning-out means 621 includes the acousto-optic element 621a provided with an ultrasonic oscillator (piezoelectric element) not illustrated, and a damper 621b. The control unit 100 transmits a modulation signal to the ultrasonic oscillator of the acousto-optic element 621a, and a pulsed laser beam LB0' is diffracted at a suitable rate to be led to the damper 621b while the pulsed laser beam LB1 remaining after the thinning-out is outputted from the first thinning-out means 621.

Figure 5:
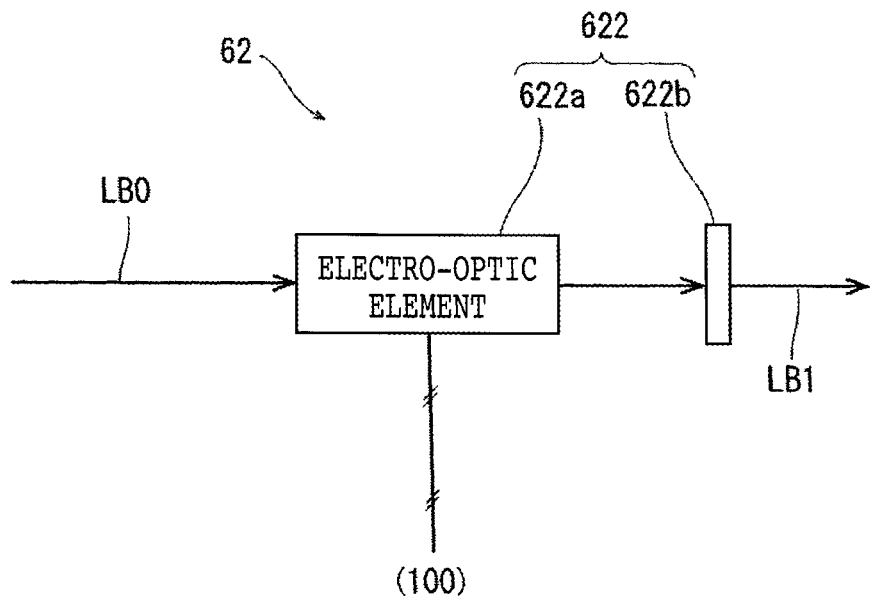
FIG. 5 is a block diagram outlining another example of the thinning-out means of FIG. 3.

It is to be noted that the thinning-out means 62 of the present invention is not limited to the first thinning-out means 621 having the acousto-optic element 621a described above. The thinning-out means 62 may adopt, in place of the first thinning-out means 621 described above, second thinning-out means 622 using an electro-optic element 622a illustrated in FIG. 5, for example. More specifically, the electro-optic element 622a utilizing an electro-optic effect and a polarization plate 622b are disposed between the first pulsed laser oscillator 61 and the $CO_2$ amplifier 63, and the control unit 100 transmits a modulation signal to the electro-optic element 622a. The electro-optic element 622a causes a polarization plane of the pulsed laser beam LB0 that has been made incident thereon to rotate according to the modulation signal, and outputs the resulting laser beam to irradiate the polarization plate 622b therewith. As a result, part of the pulsed laser beam LB0 is thinned out at a suitable rate, and the pulsed laser beam LB1 remaining after the thinning-out is outputted from the second thinning-out means 622.

The pulsed laser beam LB1, remaining after the thinning-out means 62 described above thins out part of the pulsed laser beam, advances straight as illustrated in FIG. 3 to be led to the $CO_2$ amplifier 63, where the pulsed laser beam LB1 is amplified using carbon dioxide as a medium. It is to be noted that the $CO_2$ amplifier 63 in the present embodiment includes two amplifiers, namely, a first $CO_2$ amplifier 63a and a second $CO_2$ amplifier 63b, and amplifies the pulsed laser beam LB1 stepwise. However, the present invention is not limited to this configuration, and the number of amplifiers included in the $CO_2$ amplifier 63 may be one or three or more.

Further, the optical system of the laser beam irradiation unit 6 in the present embodiment includes a reflection mirror 64 for changing the optical path of the pulsed laser beam LB1 emitted from the $CO_2$ amplifier 63 toward the condenser 66, and the condenser 66 having a focusing lens 66a for focusing the pulsed laser beam LB1 the optical path of which has been changed by the reflection mirror 64.

The pulsed laser beam LB0 emitted from the first pulsed laser oscillator 61 in the present embodiment has a wavelength set to the range of 9 to 11 μm and is set to be outputted with a pulse width of 5 ns or less as described above. However, it is preferable that the wavelength of the pulsed laser beam LB0 be adjusted as appropriate to be a wavelength excellent in absorptivity according to the material forming the passivation film 16. For example, in a case where the passivation film 16 is an $SiO_2$ film, the wavelength is preferably set to 9.1 to 9.3 μm. In another case where the passivation film 16 is formed of silicon nitride ($Si_3N_4$) or aluminum nitride (AlN), the wavelength is preferably set to 10.6 μm. In other words, in the present invention, the wavelength of the pulsed laser beam LB0 emitted from the first pulsed laser oscillator 61 is preferably set in the range of 9 to 11 μm.

The laser beam irradiation unit 6 in the present embodiment further includes, as illustrated in FIG. 3, a dichroic mirror 65 disposed on the optical path of the pulsed laser beam LB1 between the $CO_2$ amplifier 63 and the condenser 66, and a second pulsed laser oscillator 68 that emits a pulsed laser beam LB2 having a wavelength set as appropriate to a range of green to ultraviolet light (wavelength of 200 to 560 nm). The dichroic mirror 65 is set, for example, so as to reflect light having a wavelength of 200 to 600 nm and allow light having a wavelength other than above to pass therethrough. The pulsed laser beam LB2 emitted from the second pulsed laser oscillator 68 in the present embodiment is set so as to have a wavelength of 355 nm having absorptivity with respect to silicon forming the wafer 10, and its output power is set to 5 W, for example, so as to form division grooves along the planned division lines 14. The pulsed laser beam LB2 emitted from the second pulsed laser oscillator 68 is applied on the dichroic mirror 65 and reflected, and the optical path is changed to be led to the condenser 66.

Further, since the pulsed laser beam LB1 emitted from the first pulsed laser oscillator 61 has a wavelength set to the range of 9 to 11 μm as described above, it passes through the dichroic mirror 65 and advances straight to be led to the condenser 66. The pulsed laser beam LB1 having passed through the dichroic mirror 65 and the pulsed laser beam LB2 having been reflected by the dichroic mirror 65 are set such that their optical paths coincide with each other. The pulsed laser beam LB1 and the pulsed laser beam LB2 are both led to the condenser 66 to form the respective focused spots P at a same position on the front surface 10a of the wafer 10 held on the chuck table 25.

The laser processing apparatus 1 of the present embodiment is roughly configured as described above, and effects thereof are hereinafter described.

As illustrated in FIG. 1, the wafer 10 prepared as a workpiece is placed on and held under suction by the holding surface 25a of the chuck table 25 such that the front surface 10a side faces upward. The movement mechanism 30 is then actuated to move the wafer 10 held on the chuck table 25 to a position directly below the imaging unit 7, and the imaging unit 7 images the wafer 10 to detect the position of a predetermined one of the planned division lines 14 extending in a first direction, as a laser processing start position. The detected positional information is stored in the control unit 100. Meanwhile, the predetermined planned division line 14 extending in the first direction is aligned with the X-axis direction.

On the basis of the positional information of the planned division line 14 stored in the control unit 100, the movement mechanism 30 is actuated to move the laser processing start position of the predetermined planned division line 14 of the wafer 10 held on the chuck table 25 to a position directly below the condenser 66. The position of the condenser 66 in the Z-axis direction (upward-downward direction) is then adjusted such that the focused spot P is positioned on the passivation film 16 formed over the planned division lines 14 as illustrated in FIG. 3. The first pulsed laser oscillator 61, the thinning-out means 62, and the pulse width adjusting means 67 are actuated to irradiate the passivation film 16 with the pulsed laser beam LB1 that has been adjusted as described above while the X-axis direction feeding mechanism 31 is actuated to move the condenser 66 and the chuck table 25 relative to each other in the X-axis direction, so that the pulsed laser beam LB1 is applied along the planned division line 14. The passivation film 16 is subjected to ablation processing in this manner, to thereby be removed. It is to be noted that, in the present embodiment, the second pulsed laser oscillator 68 is out of actuation while irradiation with the pulsed laser beam LB1 is being carried out.

After the ablation processing is carried out along the predetermined planned division line 14 extending in the first direction, the Y-axis direction feeding mechanism 32 is actuated to index-feed the wafer 10 in the Y-axis direction by a pitch of planned division lines 14, and an unprocessed planned division line 14, which is adjacent the processed planned division line 14 in the Y-axis direction, is positioned directly below the condenser 66. In the same manner as described above, the focused spot P of the pulsed laser beam LB1 is positioned on the passivation film 16 coated over the planned division lines 14 of the wafer 10, and irradiation is carried out while the wafer 10 is being processing-fed in the X-axis direction, so that the wafer 10 is subjected to ablation processing. Similarly, the wafer 10 is processing-fed in the X-axis direction and the Y-axis direction, and the passivation film 16 is irradiated with the pulsed laser beam LB1 along all the planned division lines 14 extending in the first direction to carry out the ablation processing. The chuck table 25 is thereafter rotated by 90 degrees, and unprocessed planned division lines 14 extending in a second direction perpendicular to the planned division lines 14 extending in the first direction that have already been subjected to the ablation processing are aligned with the X-axis direction. The passivation film 16 coated over each of the remaining planned division lines 14 is also irradiated with the pulsed laser beam LB1 with the focused spot P positioned in the same manner as described above, so that the ablation processing is carried out on the passivation film 16 along all the planned division lines 14 formed on the front surface 10a of the wafer 10, thereby removing the passivation film 16.

Processing conditions in the above laser processing are set, for example, as follows:

Wavelength: 9.1 to 9.3 μm
Average output power: 5 to 10 W
Repetitive frequency: 50 to 100 kHz
Pulse width: 5 ns or less (preferably 100 to 200 ps)

After the ablation processing is carried out on the passivation film 16 along all the planned division lines 14 formed on the front surface 10a of the wafer 10 to remove the passivation film 16 in the manner described above, the first pulsed laser oscillator 61 is stopped. On the basis of the positional information of the planned division lines 14 stored in the control unit 100, the movement mechanism 30 is then actuated to again position the laser processing start position of the predetermined planned division line 14, extending in the first direction, of the wafer 10 held on the chuck table 25 directly below the condenser 66 of the laser beam irradiation unit 6. The focused spot P is then positioned on the predetermined planned division line 14, and, while the second pulsed laser oscillator 68 is actuated, the X-axis direction feeding mechanism 31 is actuated to move the condenser 66 and the chuck table 25 relative to each other in the X-axis direction. The pulsed laser beam LB2 is applied along the predetermined planned division line 14 to carry out the ablation processing, to thereby form a division groove along the planned division line 14.

Similarly, the wafer 10 is processing-fed in the X-axis direction and the Y-axis direction, and the pulsed laser beam LB2 is applied along all the planned division lines 14 extending in the first direction to carry out the ablation processing, thereby forming division grooves. The chuck table 25 is then rotated by 90 degrees, and the planned division lines 14 that are yet to be irradiated with the pulsed laser beam LB2 and extend in the second direction perpendicular to the planned division lines 14 extending in the first direction and having already been subjected to the ablation processing are aligned with the X-axis direction. Then, each of the remaining planned division lines 14 is also irradiated with the pulsed laser beam LB2 with the focused spot P positioned in the same manner as described above to form division grooves, so that the ablation processing is carried out along all the planned division lines 14 of the wafer 10, thereby forming the division grooves. Accordingly, the wafer 10 is divided into individual device chips.

In the embodiment described above, the passivation film 16 formed over the planned division lines 14 of the wafer 10 is irradiated with the pulsed laser beam LB1 described above along all the planned division lines 14 to thereby be removed, and thereafter, the pulsed laser beam LB2 is applied along all the planned division lines 14 formed on the wafer 10 to form the division grooves, thereby dividing the wafer 10 into individual device chips. However, the present invention is not limited to such a case, and alternatively, the following configuration may be adopted, for example. Specifically, a planned division line 14 of the wafer 10 is positioned directly below the condenser 66, and, while the first pulsed laser oscillator 61 and the second pulsed laser oscillator 68 are actuated, the movement mechanism 30 is actuated. The pulsed laser beam LB1 and the pulsed laser beam LB2 are simultaneously applied along each of the planned division lines 14, so that the passivation film 16 is removed along the planned division lines 14 and, at the same time, division grooves are formed, thereby dividing the wafer 10 into individual device chips.

It is to be noted that, while the laser processing apparatus 1 in the embodiment described above includes both the first pulsed laser oscillator 61 and the second pulsed laser oscillator 68, the present invention is not limited to such a configuration. The second pulsed laser oscillator 68 and the dichroic mirror 65 may be removed from the laser beam irradiation unit 6 of the laser processing apparatus 1, and laser processing may be carried out only for removing the passivation film 16 by applying the pulsed laser beam LB1 along the planned division lines 14 of the wafer 10. After the laser processing, the wafer 10 may be delivered to another laser processing apparatus including the second pulsed laser oscillator 68, where the pulsed laser beam LB2 may be applied along the planned division lines 14 of the wafer 10 to form division grooves.

According to the laser processing apparatus 1 in the embodiment described above, the pulsed laser beam LB1 applied by the laser beam irradiation unit 6 is a $CO_2$ laser beam obtained by amplification by the $CO_2$ amplifier 63, and has a wavelength set to a wavelength (9 to 11 μm) excellent in absorptivity with respect to the passivation film 16 and a pulse width set to 5 ns or less. Therefore, the passivation film 16 is quickly removed by the ablation processing, and distortion by heat due to thermal absorption does not remain in the individual device chips obtained by dividing the wafer 10. It is thus possible to solve the problem that the die strength of the individual device chips is lowered due to the distortion by heat remaining in the device chips.

Furthermore, in the present embodiment, the thinning-out means 62 is provided such that it thins out the pulsed laser beam LB0 emitted from the first pulsed laser oscillator 61 at a suitable rate. This prevents distortion by heat due to thermal absorption from remaining in the individual device chips obtained by dividing the wafer 10, and it is further ensured that the problem of lowering in die strength of the individual device chips is solved.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a chuck table for holding a workpiece;
a laser beam irradiation unit that irradiates the workpiece held on the chuck table with a pulsed laser beam to carry out processing; and
a processing-feed mechanism that processing-feeds the chuck table and the laser beam irradiation unit relative to each other,
wherein the laser beam irradiation unit includes:
a first pulsed laser oscillator that oscillates a first pulsed laser having a wavelength of 9 to 11 μm and a pulse width of 5 ns or less,
a $CO_2$ amplifier that amplifies a first pulsed laser beam emitted from the first pulsed laser oscillator, wherein the $CO_2$ amplifier includes a first $CO_2$ amplifier and a second $CO_2$ amplifier, and
a condenser that focuses the first pulsed laser beam amplified by the $CO_2$ amplifier on the workpiece held on the chuck table.

2. The laser processing apparatus according to claim 1, wherein the first pulsed laser oscillator is selected from a group consisting of a quantum cascade semiconductor laser and a distributed feedback semiconductor laser.

3. The laser processing apparatus according to claim 1, wherein the first pulsed laser oscillator uses gain-switching to adjust the pulse width.

4. A laser processing apparatus comprising:
a chuck table for holding a workpiece;
a laser beam irradiation unit that irradiates the workpiece held on the chuck table with a pulsed laser beam to carry out processing; and
a processing-feed mechanism that processing-feeds the chuck table and the laser beam irradiation unit relative to each other,
wherein the laser beam irradiation unit includes:
a first pulsed laser oscillator that oscillates a first pulsed laser having a wavelength of 9 to 11 μm and a pulse width of 5 ns or less,
a $CO_2$ amplifier that amplifies a first pulsed laser beam emitted from the first pulsed laser oscillator, and
a condenser that focuses the first pulsed laser beam amplified by the $CO_2$ amplifier on the workpiece held on the chuck table, and
thinning-out means disposed between the first pulsed laser oscillator and the $CO_2$ amplifier, wherein the thinning-out means thins out the first pulsed laser beam emitted from the first pulsed laser oscillator.

5. The laser processing apparatus according to claim 4, wherein the thinning-out means includes an acousto-optic element for thinning out the first pulsed laser beam by diffraction.

6. The laser processing apparatus according to claim 4, wherein the thinning-out means includes an electro-optic element for causing a polarization plane of the first pulsed laser beam to rotate and thinning out the first pulsed laser beam by using a polarization plate.

7. The laser processing apparatus according to claim 1, wherein the laser beam irradiation unit further includes:
a dichroic mirror disposed between the $CO_2$ amplifier and the condenser, and
a second pulsed laser oscillator that oscillates a second pulsed laser in a range of green to ultraviolet light and emits a second pulsed laser beam, and
the second pulsed laser beam emitted from the second pulsed laser oscillator is reflected by the dichroic mirror, led to the condenser, and focused on the workpiece.

8. The laser processing apparatus according to claim 4, wherein the first pulsed laser oscillator is selected from a group consisting of a quantum cascade semiconductor laser and a distributed feedback semiconductor laser.

9. The laser processing apparatus according to claim 4, wherein the first pulsed laser oscillator uses gain-switching to adjust the pulse width.

10. The laser processing apparatus according to claim 4, wherein the $CO_2$ amplifier includes a first $CO_2$ amplifier and a second $CO_2$ amplifier.

11. The laser processing apparatus according to claim 4, wherein the laser beam irradiation unit further includes:
a dichroic mirror disposed between the $CO_2$ amplifier and the condenser, and
a second pulsed laser oscillator that oscillates a second pulsed laser in a range of green to ultraviolet light and emits a second pulsed laser beam, and
the second pulsed laser beam emitted from the second pulsed laser oscillator is reflected by the dichroic mirror, led to the condenser, and focused on the workpiece.

12. The laser processing apparatus according to claim 5, wherein the first pulsed laser oscillator is selected from a group consisting of a quantum cascade semiconductor laser and a distributed feedback semiconductor laser.

13. The laser processing apparatus according to claim 5, wherein the first pulsed laser oscillator uses gain-switching to adjust the pulse width.

14. The laser processing apparatus according to claim 5, wherein the $CO_2$ amplifier includes a first $CO_2$ amplifier and a second $CO_2$ amplifier.

15. The laser processing apparatus according to claim 5, wherein the laser beam irradiation unit further includes:
a dichroic mirror disposed between the $CO_2$ amplifier and the condenser, and
a second pulsed laser oscillator that oscillates a second pulsed laser in a range of green to ultraviolet light and emits a second pulsed laser beam, and
the second pulsed laser beam emitted from the second pulsed laser oscillator is reflected by the dichroic mirror, led to the condenser, and focused on the workpiece.

16. The laser processing apparatus according to claim 6, wherein the first pulsed laser oscillator is selected from a group consisting of a quantum cascade semiconductor laser and a distributed feedback semiconductor laser.

17. The laser processing apparatus according to claim 6, wherein the first pulsed laser oscillator uses gain-switching to adjust the pulse width.

18. The laser processing apparatus according to claim 6, wherein the $CO_2$ amplifier includes a first $CO_2$ amplifier and a second $CO_2$ amplifier.

19. The laser processing apparatus according to claim 6, wherein the laser beam irradiation unit further includes:
a dichroic mirror disposed between the $CO_2$ amplifier and the condenser, and
a second pulsed laser oscillator that oscillates a second pulsed laser in a range of green to ultraviolet light and emits a second pulsed laser beam, and
the second pulsed laser beam emitted from the second pulsed laser oscillator is reflected by the dichroic mirror, led to the condenser, and focused on the workpiece.

* * * * *